(12) United States Patent
Watterson et al.

(10) Patent No.: US 6,498,800 B1
(45) Date of Patent: Dec. 24, 2002

(54) DOUBLE ETALON OPTICAL WAVELENGTH REFERENCE DEVICE

(75) Inventors: Reich Watterson, Lexington, MA (US); Parviz Tayebati, Boston, MA (US); Don McDaniel, North Andover, MA (US); Kevin McCallion, Boston, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/636,807

(22) Filed: Aug. 10, 2000

Related U.S. Application Data

(60) Provisional application No. 60/148,148, filed on Aug. 10, 1999.

(51) Int. Cl.[7] .............................................. H01S 3/10
(52) U.S. Cl. ...................................... 372/20; 372/21
(58) Field of Search .................................. 372/20, 21

(56) References Cited

U.S. PATENT DOCUMENTS

| | | | |
|---|---|---|---|
| 4,947,398 A | * 8/1990 | Yasuda et al. ................. 372/29 |
| 4,998,256 A |   3/1991 | Ohshima et al. .............. 372/32 |
| 5,428,700 A |   6/1995 | Hall ............................ 372/32 |
| 5,798,859 A | * 8/1998 | Colbourne et al. .......... 359/247 |
| 5,825,792 A |  10/1998 | Villeneuve et al. ........... 372/32 |
| 5,838,437 A | * 11/1998 | Miller et al. ................. 356/345 |
| 5,892,582 A | * 4/1999 | Bao et al. .................... 356/345 |
| 5,970,076 A | * 10/1999 | Hamada et al. ............... 372/20 |
| 6,043,883 A |   3/2000 | Leckel et al. ............... 356/454 |
| 6,078,394 A | * 6/2000 | Wood ......................... 356/352 |
| 6,088,142 A |   7/2000 | Cao et al. .................... 359/132 |
| 6,097,487 A | * 8/2000 | Kringlebotn et al. ....... 356/345 |
| 6,134,253 A | * 10/2000 | Munks et al. ................ 372/38 |

\* cited by examiner

*Primary Examiner*—Paul Ip
*Assistant Examiner*—Jeffrey Zahn
(74) *Attorney, Agent, or Firm*—Pandiscio & Pandiscio

(57) ABSTRACT

A compact wavelength monitoring and control assembly for a narrow band (i.e., laser) source is provided, comprising two narrow bandpass, wavelength selective transmission filter elements of Fabry-Perot structure through which two separate collimated beams from a laser source are directed onto two photodetectors. The spacing of the multiple transmission maxima for one etalon is chosen to match that of the desired set of frequencies to be used for locking purposes. The spacing of the transmission maxima for the second etalon is used, in combination with a dielectric filter, to generate a wavelength fiducial to denote an absolute frequency. The spacing of the second etalon is chosen to be much wider than the frequency grid etalon. A control circuit processes the simultaneously acquired signals from the two detectors as the laser wavelength is varied. The device functions as an optical wavelength discriminator in which the detectors convert optical energy to current (or voltage) for a feedback loop for controlling the laser source. Any one of a large number of discrete, predetermined wavelengths may be chosen for locking using the same device. The system is compact and may be packaged within the same temperature controlled laser assembly for maximum performance and minimum circuit board space requirements.

3 Claims, 5 Drawing Sheets

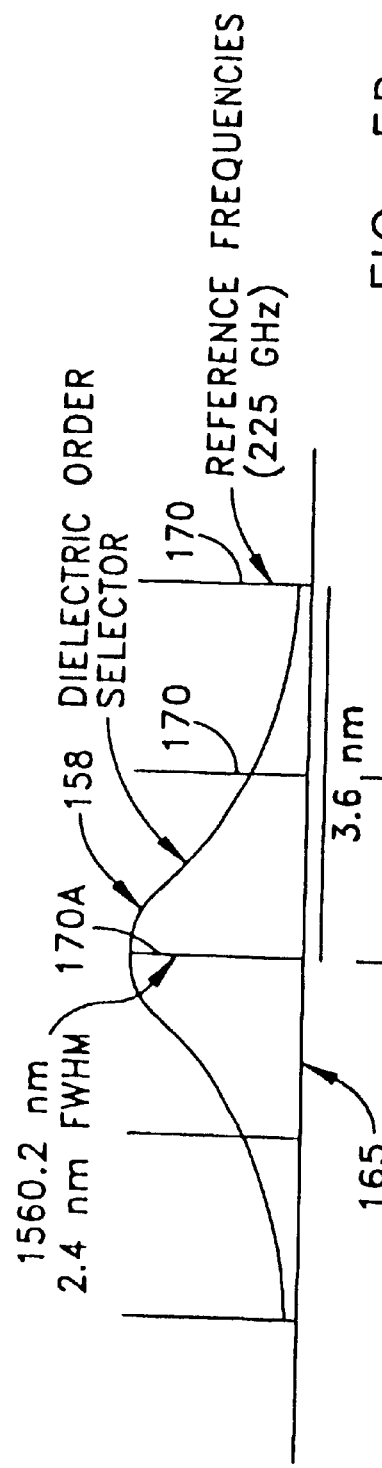
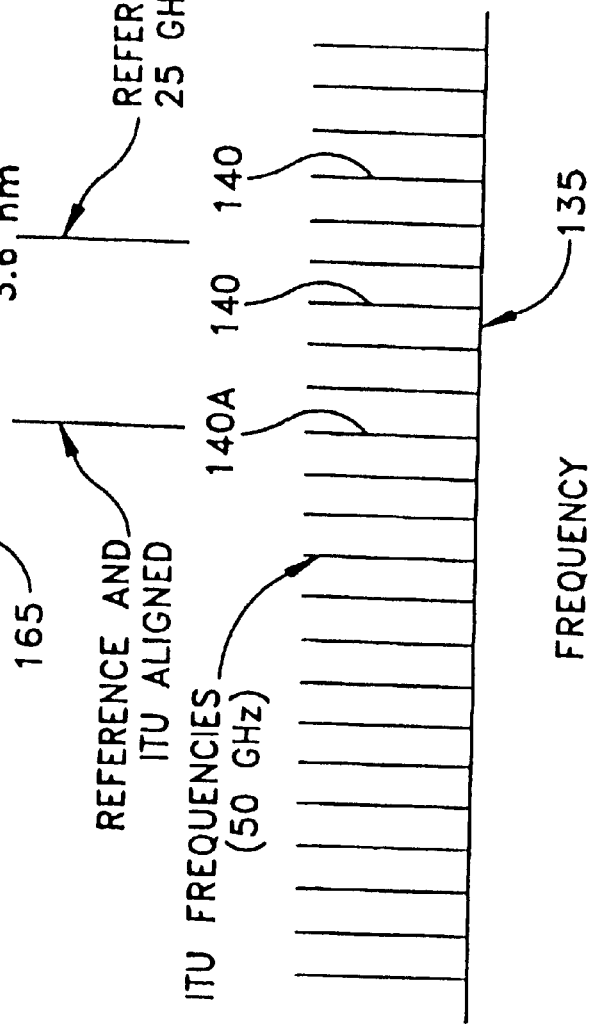
FIG. 5A
FIG. 5B

DOUBLE ETALON OPTICAL WAVELENGTH REFERENCE DEVICE

REFERENCE TO PENDING PRIOR PATENT APPLICATION

This patent application claims benefit of pending prior U.S. Provisional Patent Application Serial No. 60/148,148, filed Aug. 10, 1999 by Parviz Tayebati et al. for DOUBLE ETALON OPTICAL WAVELENGTH REFERENCE DEVICE, which patent application is hereby incorporated herein by reference.

FIELD OF THE INVENTION

This invention relates to photonic devices in general, and more particularly to tunable filters and tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent applications Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium (or "active region") 55 between bottom mirror 20 and bottom electrode 15. As a result, when gain medium 55 is appropriately stimulated, e.g., by optical pumping, lasing can be established within air cavity 45, between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune VCSEL 50.

Tunable Fabry-Perot filters and tunable VCSEL's of the type disclosed in the aforementioned U.S. patent applications Ser. Nos. 09/105,399 and 09/543,318 are highly advantageous since they can be quickly and easily tuned by simply changing the voltage applied across the top electrode and the bottom electrode.

However, it has been found that tunable Fabry-Perot filters and tunable VCSEL's of the type disclosed in U.S. patent applications Ser. Nos. 09/105,399 and 09/543,318 have performance characteristics which can vary slightly from unit to unit. In addition, it has also been found that the performance characteristics of any given unit can vary slightly in accordance with its age, temperature, etc. Accordingly, it is generally not possible to precisely predict in advance the exact voltage which must be applied to a particular device in order to tune that device to a specific frequency. This can present an issue in some applications, particularly telecommunications applications, where the devices may need to be tuned to precise, absolute wavelengths.

OBJECTS OF THE INVENTION

As a result, one object of the present invention is to provide a novel wavelength reference apparatus for calibrating a tunable Fabry-Perot filter and/or a tunable VSCEL, whereby the device may be tuned to a precise, absolute wavelength.

Another object of the present invention is to provide a novel wavelength-locking apparatus for tuning a tunable Fabry-Perot filter and/or a tunable VCSEL to a precise, absolute wavelength, and for thereafter keeping that device tuned to that wavelength.

Still another object of the present invention is to provide a novel method for calibrating a tunable Fabry-Perot filter and/or a tunable VSCEL, whereby the device may be tuned to a precise, absolute wavelength.

Yet another object of the present invention is to provide a novel method for wavelength-locking a tunable Fabry-Perot filter and/or a tunable VCSEL, whereby to tune the device to a precise, absolute wavelength, and for thereafter keeping that device tuned to that wavelength.

SUMMARY OF THE INVENTION

These and other objects are addressed by the present invention.

In one form of the invention, there is provided a wavelength reference apparatus for use in calibrating a tunable Fabry-Perot filter or a tunable VCSEL to a precise, absolute frequency on a target frequency grid, the wavelength reference apparatus comprising: a first etalon, wherein the first etalon is chosen so as to have its transmission peaks spaced at the target frequency grid; a first detector for detecting the transmission peaks established by the first etalon; a dielectric filter and a second etalon, wherein the dielectric filter is chosen so as to have its transmission peak centered on a peak in the target frequency grid and the second etalon is chosen so as to have its transmission peaks spaced significantly further apart than the target frequency grid; and a second detector for detecting a transmission peak established by the dielectric filter in series with the second etalon; whereby when monotonic light is swept through the apparatus, the transmission peak established by the dielectric filter and the second etalon will identify a specific frequency on the target frequency grid.

In another form of the invention, there is provided a wavelength-locking apparatus for use in tuning a tunable Fabry-Perot filter or a tunable VCSEL to a precise, absolute frequency on a target frequency grid, the wavelength locking apparatus comprising: a first etalon, wherein the first etalon is chosen so as to have its transmission peaks spaced at the target frequency grid; a first detector for detecting the transmission peaks established by the first etalon; a dielectric filter and a second etalon, wherein the dielectric filter is chosen so as to have its transmission peak centered on a peak in the target frequency grid and the second etalon is chosen so as to have its transmission peaks spaced significantly further apart than the target frequency grid; a second detector for detecting a transmission peak established by the dielectric filter in series with the second etalon; whereby when monotonic light is swept through the apparatus, the transmission peak established by the dielectric filter and the second etalon will identify a specific frequency on the target frequency grid; and a controller for tuning the wavelength of the device by monitoring the transmission peaks of the first etalon.

In still another form of the invention, there is provided a method for tuning a tunable Fabry-Perot filter or a tunable VCSEL, comprising the steps of: (1) simultaneously sweeping the wavelength of light output by the device in a monotonic manner through (i) a first etalon so as to generate an inline comb of optical transmission peaks, the first etalon being chosen so as to have its transmission peaks spaced at a desired target frequency grid, and (ii) a dielectric filter and a second etalon, where the dielectric filter is chosen so as to have its transmission peak centered on a peak in the target frequency grid and the second etalon is chosen so as to have its transmission peaks spaced significantly further apart than the target frequency grid; (2) identifying the frequency of the transmission peak of the dielectric filter and the second etalon, and a corresponding one of the transmission peaks of the first etalon; and (3) monitoring the output of the first etalon as the device is tuned so as to tune the device to a desired frequency.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein:

FIG. 5 shows the optical transmission functions of the two optical branches of the wavelength reference apparatus shown in FIG. 4.

DETAILED DESCRIPTION OF THE PREFERRED EMBODIMENTS

Figure 1:
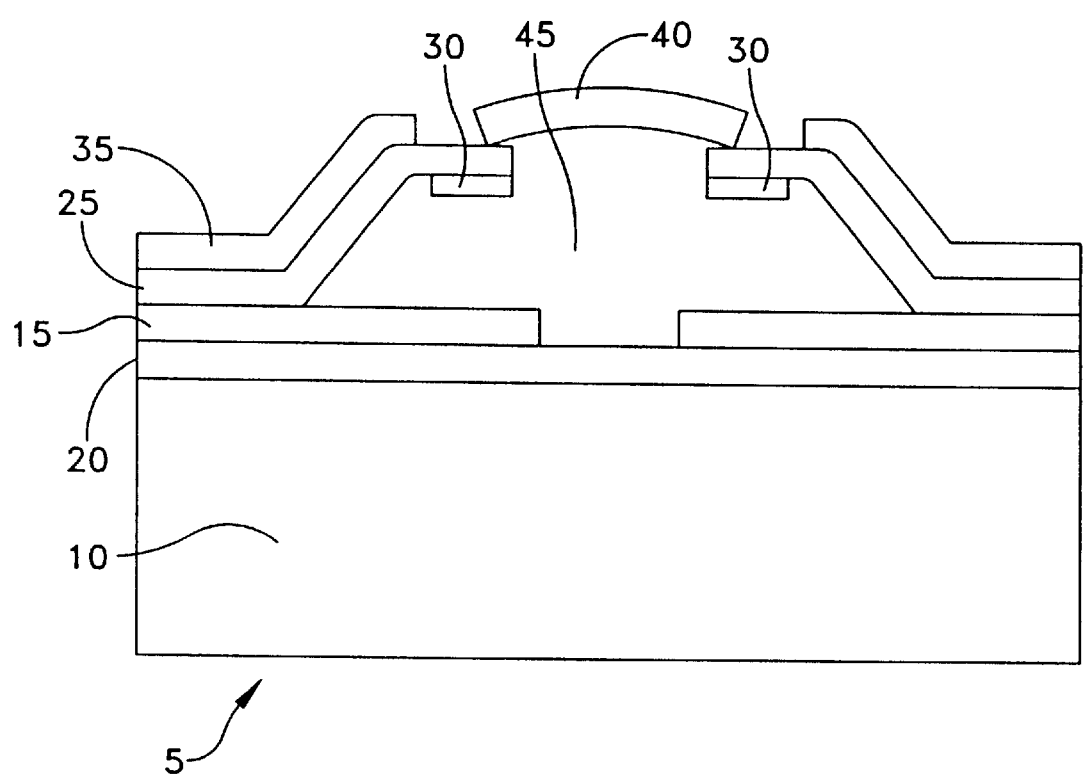
FIG. 1 is a schematic side view of a tunable Fabry-Perot filter.
Figure 2:
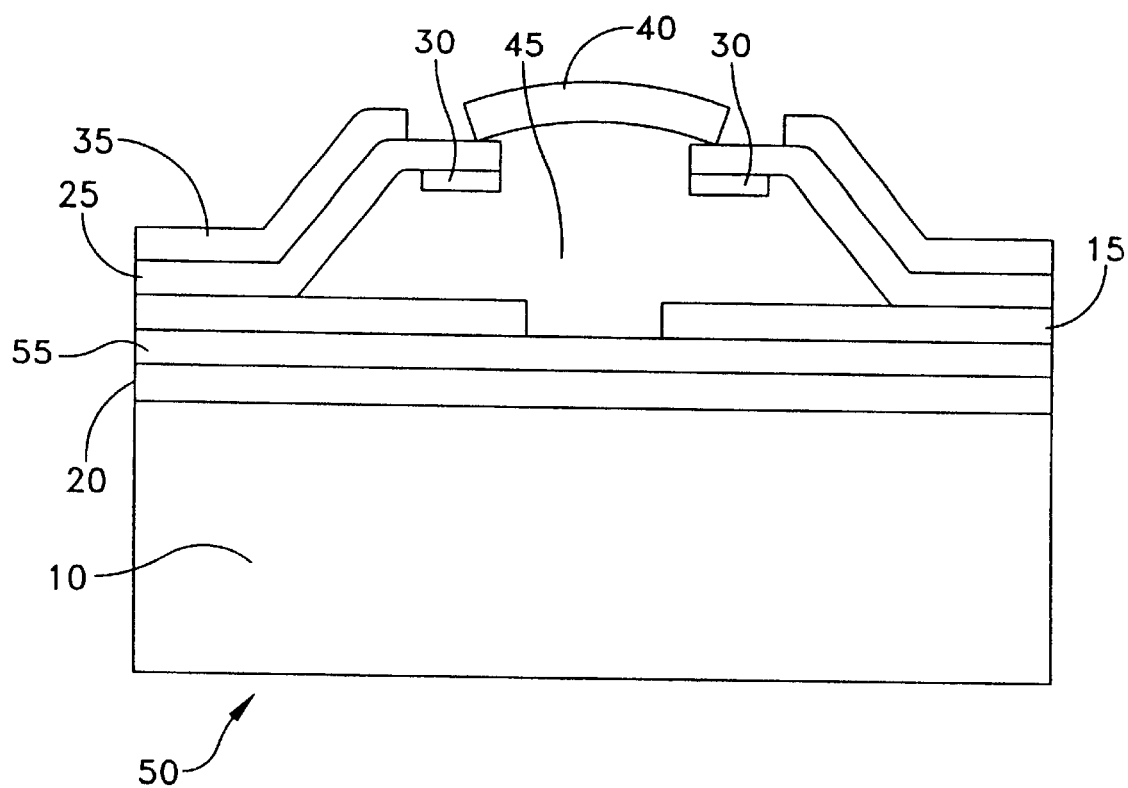
FIG. 2 is a schematic side view of a tunable VCSEL.
Figure 3:
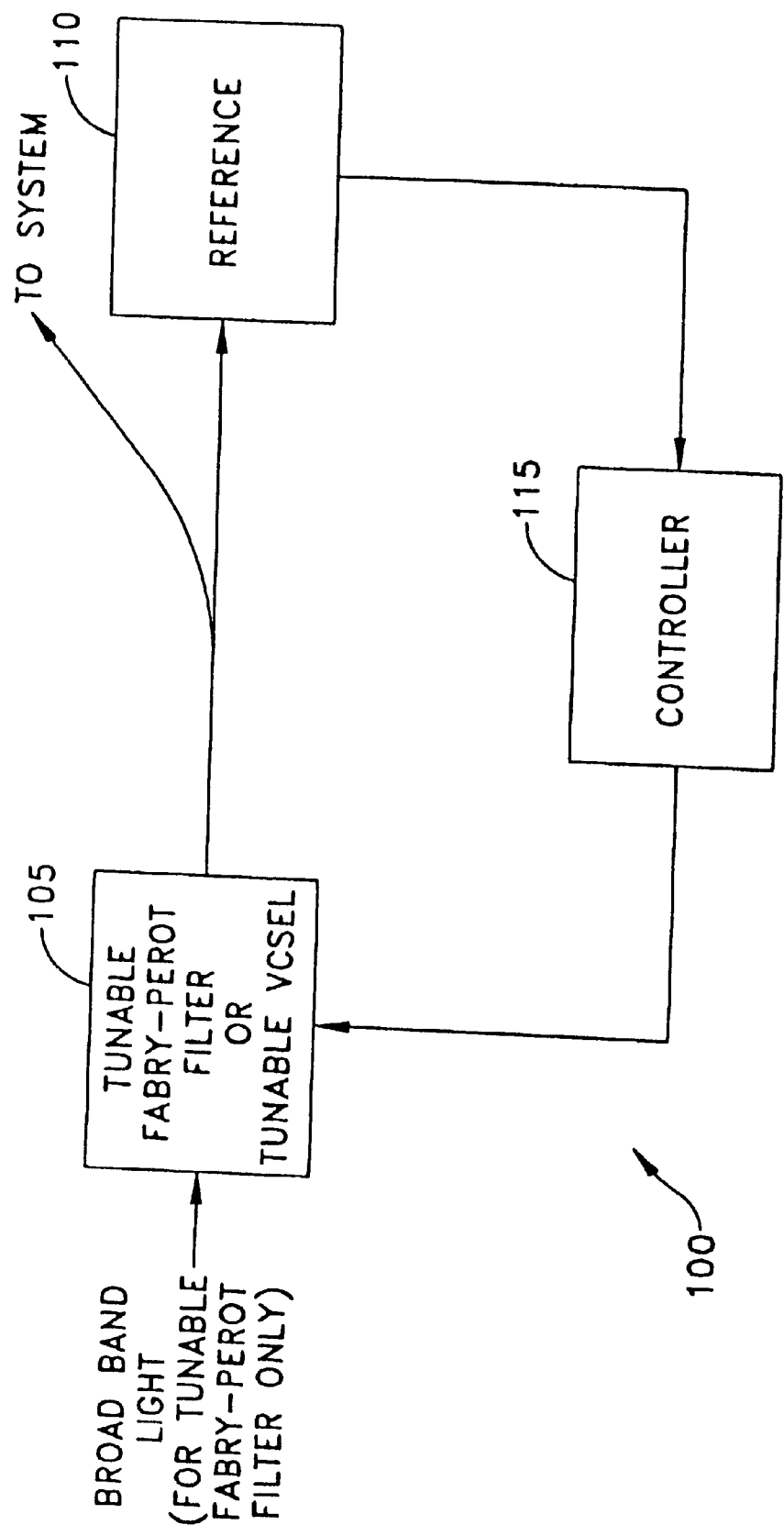
FIG. 3 is a schematic diagram of wavelength reference apparatus and wavelength-locking apparatus for tuning a tunable Fabry-Perot filter and/or a tunable VCSEL to a desired frequency, and for thereafter keeping that device tuned to that frequency.

Looking next at FIG. 3, there is shown a system 100 which comprises a wavelength reference apparatus for calibrating a tunable Fabry-Perot filter and/or a tunable VCSEL, whereby the device may be tuned to a precise, absolute wavelength. System 100 also provides a wavelength-locking apparatus to keep the tunable Fabry-Perot filter and/or tunable VCSEL tuned to a precise, absolute wavelength.

More particularly, system 100 generally comprises a tunable Fabry-Perot filter or tunable VCSEL 105, a wavelength reference apparatus 110, and a controller 115.

Tunable Fabry-Perot filter or tunable VCSEL 105 preferably comprises a tunable Fabry-Perot filter or tunable VCSEL of the type disclosed in the aforementioned U.S. patent applications Ser. Nos. 09/105,399 and 09/543,318. For convenience of description, tunable device 105 will hereinafter be described in the context of being a tunable VCSEL; however, it will be appreciated that the present invention is equally applicable to the situation where tunable device 105 comprises a tunable Fabry-Perot filter.

Wavelength reference device 110 is adapted to provide a precise reference frequency at multiple wavelengths over the wavelength region of interest. These precise reference frequencies are located on precise, absolute wavelengths.

Figure 4:
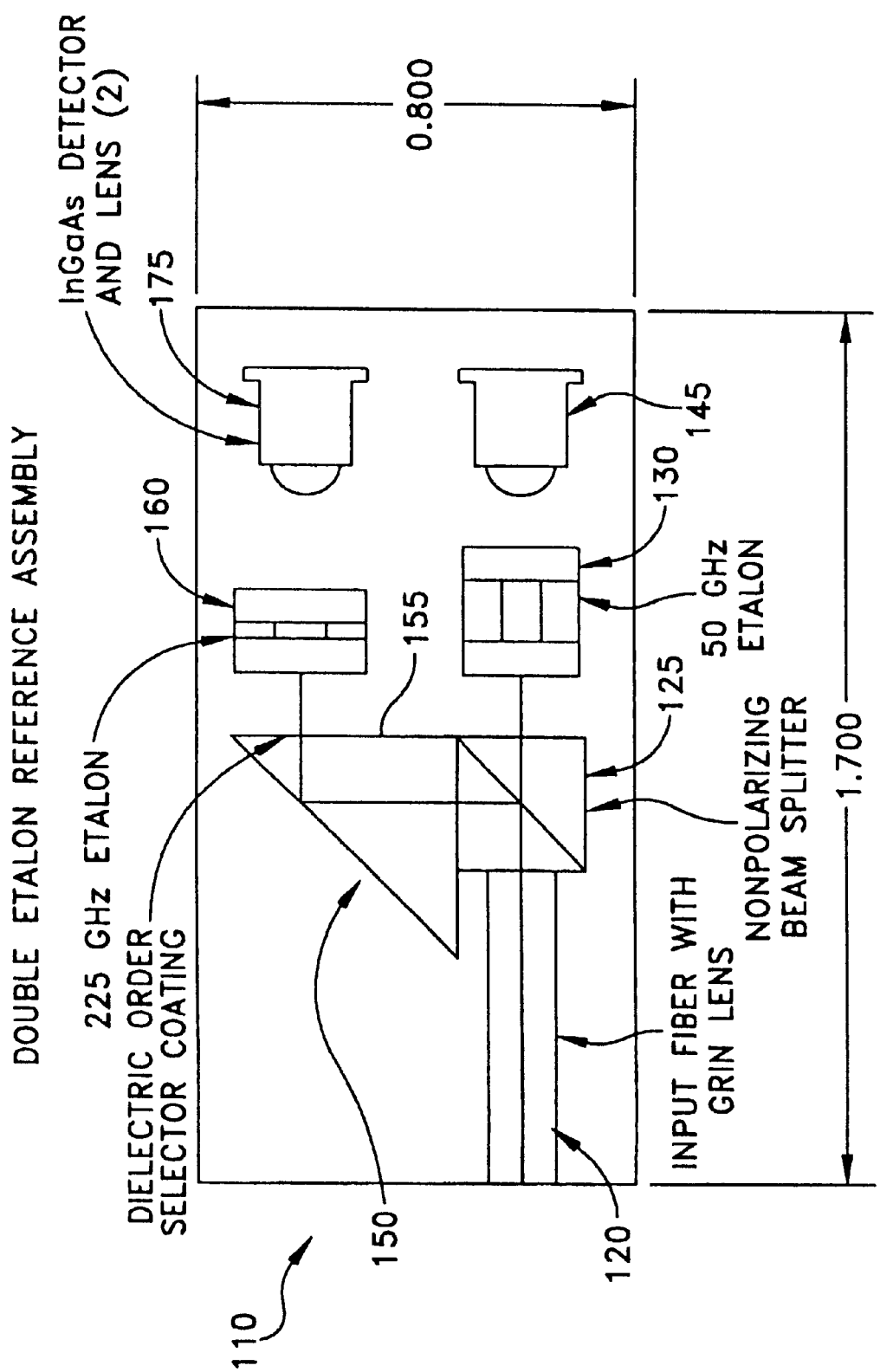
FIG. 4 is a schematic diagram of wavelength reference apparatus formed in accordance with the present invention.

In accordance with a preferred embodiment of the invention, and looking now at FIG. 4, wavelength reference device 110 is constructed so that light from VCSEL 105 is input via an optical fiber 120 and collimated by, for example, a GRIN lens. A beam splitting device 125 (for example, a non-polarizing beam splitting cube) divides the light into two portions.

One portion of the light passes through a Fabry-Perot etalon 130, which generates a comb of transmission peaks spaced at the desired spacing, e.g., as shown by the comb 135 of transmission peaks 140 shown in FIG. 5A, where the transmission peaks have a 50 $GH_z$ spacing. The light transmitted by first etalon 130 is focused by a lens and detected by a suitable detector 145 (an InGaAs detector, for example).

The second light path proceeds through a 90-degree prism 150. A dielectric filter 155 is applied to the surface of the prism; this dielectric filter 155 has a transmission profile 158 as shown in FIG. 5B. Light which has passed through dielectric filter 155 is then passed through a second etalon 160.

This second etalon 160 has a distinct, and larger, mode spacing than the aforementioned first etalon 130 in the first light path. See, for example, the comb 165 of transmission peaks 170 shown in FIG. 5B, where the transmission peaks have a 225 $GH_z$ spacing. Finally the light which has passed through both dielectric filter 155 and second etalon 160 is focused and detected by a second detector 175.

By placing dielectric filter 155 and second etalon 160 in series, only light having a wavelength matching the transmission profiles of both dielectric filter 155 and second etalon 160 can pass through to second detector 175. In particular, because of the construction of dielectric filter 155 and second etalon 160, only light at a single frequency-can pass through the transmission profile of dielectric-filter 155 and the transmission profile of second etalon 160; and, significantly, this single frequency will always be precisely and absolutely known from the construction of dielectric filter 155 and second etalon 160. By way of example, but not limitation, in the example of FIG. 5B, this single known frequency will exist at the transmission peak 170A of second etalon 160.

In order to calibrate the tunable VCSEL 105, light from VCSEL 105 is monotonically swept across the wavelengths of interest as the first and second detectors 145, 175 are monitored. When second detector 175 (i.e., the detector monitoring the output of dielectric filter 155 and second etalon 160) detects an output peak, the light from VCSEL 105 will be at the wavelength where the peaks of dielectric filter 155 and second etalon 160 match, i.e., at the single known frequency referred to above. Thus, the wavelength reference device 110 permits calibration of tunable VCSEL 105 against the single known frequency defined by the convergence of the transmission profile 158 of dielectric filter 155 and the transmission profile 165 of second etalon 160.

At the same time, the output of first detector 130 can be calibrated against this same known frequency, i.e., the specific peak 140A for the same reference frequency will also be known. Furthermore, once the specific peak 140A is known, the output of first detector 130 can be used to tune tunable VCSEL 105 to any given frequency 140 on the comb 135 of transmission peaks 140.

Furthermore, once VCSEL 105 has been tuned to a desired target frequency, the output of detector 145 can be monitored; if this output drifts off the desired transmission peak (i.e., indicating that VCSEL 105 has drifted off the desired target frequency), the system can adjust the voltage being applied to VCSEL 105 so as to bring the VCSEL back to the desired frequency.

In essence, first etalon 130 provides narrow maximum transmission peaks for use by a wavelength locking circuit for locking to any one peak. The second etalon's free spectral range is chosen in such a manner as to require only a simple, series dielectric order selection filter in order to isolate a single known frequency. This single, known wavelength (frequency) is used by the controlling circuit to determine the proper peak generated by the first etalon for locking.

Controller 115 comprises circuitry for reading the output of detectors 145, 175 and adjusting the voltage applied to VCSEL 105 so as to tune VCSEL 105 to the desired wavelength, and to thereafter keep it tuned to that wavelength.

More particularly, the basic wavelength reference device consists of two air-spaced Fabry-Perot etalons 130, 160 and an optical dielectric bandpass filter 155. Light introduced into either etalon will be transmitted at multiple frequencies (wavelengths). The transmission frequencies will be integer multiples of the free spectral range ("FSR") defined as $FSR=c/2nL$, where c is the speed of light, n is the refractive index of air, and /. is the physical length of the etalon. The FSR could be chosen to be equal to the ITU Wavelength Division Multiplexing grid (200 GHz, 100 GHz, 50 GHz, 25 GHz). The corresponding etalon lengths are approximately 0.75 mm, 1.50 mm, 3.0 mm, and 6.0 mm. In the vicinity of each such multiple of the FSR, optical frequencies will be transmitted over a range of frequencies ~FSR/finesse, where finesse is determined by the reflectivity of the Fabry-Perot plates.

The two etalons 130, 160 will be illuminated in parallel. One etalon, i.e., etalon 130, will provide a grid of narrow peaks to be used for locking the tunable laser. The width of the peak is adjusted by the choice of the value of the finesse. The free spectral range will typically be chosen to match the desired ITU grid (50 GHz, for example). A combination of manufacturing tolerances (of the etalon assembly) and optical alignment (angle tuning) will ensure that an accurate 50 GHz free spectral range is obtained.

The second etalon, i.e., etalon 160, is designed in such a manner as to denote, in combination with a dielectric filter, a single known wavelength. The control electronics simultaneously monitor the transmitted optical intensity (via photodetectors) as a tunable laser source (or broadband light transmitted by a tunable filter) monotonically varies the wavelength of the light input to the wavelength reference device 110.

A single known wavelength is denoted by choosing the free spectral range of the second etalon 160 to be as large as practical (225 GHz, for example) and of such a value as to meet two requirements: (1) one of the desired ITU frequencies must be an integer multiple of the larger free spectral range, and (2) the ratio of the free spectral range to the ITU grid spacing should be as large as possible and half integer (225 GHz/50 GHz=4.5 in this example). Such a half integer choice will have the result that an overlap between the large FSR etalon 160 and the 50 GHz etalon 130 will occur every two periods of the large FSR etalon 160, thus making the design of the dielectric order selection filter simpler. Possible choices for overlap frequencies (which span the ITU C band) are: 190.35, 191.25, 192.15, 193.05, 193.95, 194.85, 195.75, 196.65 THz or, in wavelengths: 1574.95, 1567.54, 1560.20, 1552.93, 1545.72, 1538.58, 1531.51, 1524.50 nm.

A single mode of second etalon 160 will be isolated via the dielectric filter 155 placed in series with that etalon. Since the spacing between modes is much larger than the fundamental grid, the requirements that the dielectric filter must meet are significantly relaxed. In this example, the optical filter passband may be as wide as 3 nm, rather than 0.3 nm.

If desired, dielectric coatings on a single plate may perform beam splitting.

And beam collimation may performed using other lens types (e.g., plano-convex, asphere, etc.).

Also, beam bending angles may be other than 90 degrees.

Furthermore, mirrors rather than prisms may be used for beam splitting and/or bending.

Also, the dielectric passband filter 155 may be a bandstop filter.

And the transmission width may be somewhat different than the value shown.

Or a different overlap frequency between the short period etalon 130 and the long period etalon 160 may be chosen, e.g., every third or fourth period.

The free spectral range of the short period etalon may be chosen at 50 GHz, 100 GHz or 200 GHz and still meet ITU requirements.

The dielectric bandpass filter may be a separate element.

The dielectric bandpass filter may be incorporated as part of a reflective element.

The dielectric bandpass filter may be much narrower than discussed above.

The two detectors may be incorporated into a single package.

More than one reference frequency may be generated (outside or within the band of interest).

Furthermore, larger diameter detectors may be used without focusing lenses.

Also, the dielectric filter may be applied directly on the input face of etalon 160, thus comprising a single integral package.

Advantages of the Invention

Numerous advantages are obtained through the provision of the present invention.

For one thing, the present invention provides a stable, robust, absolute optical wavelength reference for use in wavelength referencing and locking.

And the present invention provides a compact physical design.

In addition, temperature stabilization will not be required; and no optical switching is required.

Modifications

It is to be understood that the present invention is by no means limited to the particular constructions and method steps disclosed above,e and/or shown in the drawings, but also comprises any modifications or equivalents within the scope of the claims.

What is claimed is:

1. A wavelength reference apparatus for use in calibrating light output from a tunable optical device to a precise, absolute frequency on a target frequency grid, the wavelength reference apparatus comprising:

a beam splitter;

a light pathway extending between the optical device and the beam splitter;

a first etalon configured to receive light from the beam splitter, wherein the first etalon is chosen so as to have its transmission peaks spaced at the target frequency grid;

a first detector for detecting the transmission peaks established by the first etalon;

a dielectric filter and a second etalon configured to receive light from the beam splitter, wherein the dielectric filter is chosen so as to have its transmission peak centered on a peak in the target frequency grid and the second etalon is chosen so as to have its transmission peaks spaced significantly further apart than the target frequency grid; and a second detector for detecting a transmission peak established by the dielectric filter in series with the second etalon;

whereby when monotonic light from the tunable optical device is swept into the light pathway and through the apparatus, the transmission peak established by the dielectric filter and the second etalon will identify a specific frequency on the target frequency grid that corresponds to the wavelength of the monotonic light provided by the tunable optical device.

2. A wavelength reference apparatus for use in calibrating light output from a tunable optical device to a precise, absolute frequency on a target frequency grid, the wavelength reference apparatus comprising:

a beam splitter;

a light pathway extending between the optical device and the beam splitter;

a first etalon configured to receive light from the beam splitter, wherein the first etalon is chosen so as to have its transmission peaks spaced at the target frequency grid;

a first detector for detecting the transmission peaks established by the first etalon;

a dielectric filter and a second etalon configured to receive light from the beam splitter, wherein the dielectric filter is chosen so as to have its transmission peak centered on a peak in the target frequency grid and the second etalon is chosen so as to have its transmission peaks spaced significantly further apart than the target frequency grid;

a second detector for detecting a transmission peak established by the dielectric filter in series with the second etalon;

whereby when monotonic light from the tunable optical device is swept into the light pathway and through the apparatus, the transmission peak established by the dielectric filter and the second etalon will identify a specific frequency on the target frequency grid that corresponds to the wavelength of the monotonic light provided by the tunable optical device; and a controller for tuning the wavelength of the device by monitoring the transmission peaks of the first etalon.

3. A method for tuning light output of a tunable optical device, comprising the steps of:

(1) simultaneously sweeping the wavelength of the light output from the tunable optical device in a monotonic manner along a light pathway to a beam splitter and through each of (1) a first etalon so as to generate an inline comb of optical transmission peaks, the first etalon being chosen so as to have its transmission peaks spaced at a desired target frequency grid, and (2) a dielectric filter and a second etalon, where the dielectric filter is chosen so as to have its transmission peak centered on a peak in the target frequency grid and the second etalon is chosen so as to have its transmission peaks spaced significantly further apart than the target frequency grid;

(2) identifying the frequency of the transmission peak of the dielectric filter and the second etalon, and a corresponding one of the transmission peaks of the first etalon; and (3) monitoring the output of the first etalon as the device is tuned so as to tune the device to a desired frequency.

\* \* \* \* \*